United States Patent
Tsai

(10) Patent No.: US 9,214,549 B2
(45) Date of Patent: Dec. 15, 2015

(54) HIGH VOLTAGE DEVICE HAVING SCHOTTKY DIODE

(71) Applicant: UNITED MICROELECTRONICS CORP., Hsin-Chu (TW)

(72) Inventor: Min-Hsuan Tsai, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/504,438

(22) Filed: Oct. 2, 2014

(65) Prior Publication Data

US 2015/0054116 A1 Feb. 26, 2015

Related U.S. Application Data

(62) Division of application No. 12/884,215, filed on Sep. 17, 2010, now Pat. No. 8,878,329.

(51) Int. Cl.
| H01L 29/78 | (2006.01) |
|---|---|
| H01L 27/06 | (2006.01) |
| H01L 29/872 | (2006.01) |
| H01L 29/47 | (2006.01) |
| H01L 29/66 | (2006.01) |
| H01L 29/06 | (2006.01) |

(52) U.S. Cl.
CPC .......... *H01L 29/782* (2013.01); *H01L 27/0629* (2013.01); *H01L 29/0653* (2013.01); *H01L 29/47* (2013.01); *H01L 29/7839* (2013.01); *H01L 29/872* (2013.01); *H01L 29/0623* (2013.01); *H01L 29/0638* (2013.01)

(58) Field of Classification Search
CPC ............ H01L 27/0629; H01L 29/0623; H01L 29/0638; H01L 29/0653; H01L 29/47; H01L 29/782; H01L 29/7839; H01L 29/872

USPC .......................... 257/453–456; 438/471–479
See application file for complete search history.

(56) References Cited

U.S. PATENT DOCUMENTS

| 4,396,999 | A | 8/1983 | Malaviya | |
|---|---|---|---|---|
| 4,958,089 | A | 9/1990 | Fitzpatrick et al. | |
| 5,049,953 | A | 9/1991 | Mihara et al. | |
| 6,066,884 | A | 5/2000 | Krutsick | |
| 6,846,729 | B2 | 1/2005 | Andoh et al. | |
| 7,939,904 | B2 * | 5/2011 | Kimoto | H01L 29/512 257/471 |
| 9,142,662 | B2 * | 9/2015 | Ryu | H01L 29/0696 |
| 2004/0012066 | A1 * | 1/2004 | Dietl | H01L 29/872 257/471 |
| 2005/0184343 | A1 * | 8/2005 | Thornton | H01L 27/095 257/351 |
| 2005/0285188 | A1 * | 12/2005 | Khemka | H01L 29/7835 257/338 |
| 2006/0001057 | A1 * | 1/2006 | Khemka | H01L 29/66143 257/280 |
| 2008/0135970 | A1 | 6/2008 | Kim | |
| 2008/0185629 | A1 | 8/2008 | Nakano et al. | |
| 2009/0020826 | A1 | 1/2009 | Huang | |
| 2009/0294865 | A1 | 12/2009 | Tang et al. | |
| 2010/0032731 | A1 * | 2/2010 | Babcock | H01L 27/095 257/280 |
| 2011/0156679 | A1 * | 6/2011 | Girdhar | H01L 27/0629 323/282 |
| 2011/0263112 | A1 | 10/2011 | Trivedi | |

* cited by examiner

*Primary Examiner* — Mohammed Shamsuzzaman
(74) *Attorney, Agent, or Firm* — Winston Hsu; Scott Margo

(57) ABSTRACT

A high voltage device having Schottky diode includes a semiconductor substrate, a Schottky diode formed on the semiconductor substrate, at least a first doped region having a first conductive type formed in the semiconductor substrate and under the Schottky diode, and a control gate positioned on the semiconductor substrate. The control gate covers a portion of the Schottky diode and the first doped region positioned on the semiconductor substrate.

6 Claims, 2 Drawing Sheets

HIGH VOLTAGE DEVICE HAVING
SCHOTTKY DIODE

CROSS REFERENCE TO RELATED
APPLICATIONS

This application is a division of U.S. application Ser. No. 12/884,215 filed on Sep. 17, 2010, and incorporated herein by reference in its entirety.

BACKGROUND OF THE INVENTION

1. Field of the Invention

This invention relates to a high voltage device having a Schottky diode, and to a high voltage device having a Schottky diode integrated with a metal-oxide-semiconductor (MOS) transistor.

2. Description of the Prior Art

Power devices are required to be fast switching and sustainable to high voltage of hundreds Volts (V). Therefore high voltage (HV) devices such as HV metal-oxide-semiconductor (HVMOS) transistor, insulated gate bipolar transistor (IGBT), and Schottky diode which have high-speed switching characteristics have been developed and commonly used for power conversion, power control, and so forth of the power system in instruments such as home appliances, communication devices and control devices of in-vehicle motor.

Among those HV devices, Schottky diode's voltage drop at a forward bias of about 1 mA is in the rage of 0.15 V to 0.45 V, while the conventional silicon diode is of about 0.6 V. Therefore Schottky diode is more preferable in voltage-clamping applications and in applications for preventing transistor saturation.

SUMMARY OF THE INVENTION

According to a first aspect of the present invention, there is provided a high voltage device having Schottky diode. The high voltage device includes a semiconductor substrate, at least a dielectric region formed in the semiconductor substrate, a Schottky diode formed on the semiconductor substrate, at least a salicide block (SAB) positioned on the semiconductor substrate, and at least a first heavily doped region having a first conductive type formed in the semiconductor substrate under the SAB. The first heavily doped region is non-contacting with the Schottky diode.

According to a second aspect of the present invention, there is provided a high voltage device having Schottky diode. The high voltage device includes a semiconductor substrate, a Schottky diode formed on the semiconductor substrate, at least a first doped region having a first conductive type formed in the semiconductor substrate and under the Schottky diode, and a control gate positioned on the semiconductor substrate. The control gate covers a portion of the Schottky diode and the first doped region.

According to the high voltage device having the Schottky diode provided by the present invention, the advantage features of the present invention includes high operating voltage and prevention of leakage current due to the provided first heavily doped region. According to another high voltage device having the Schottky diode integrated with the MOS transistor, the advantage features of the present invention includes improved turn-on speed and thus such high voltage device renders a protection function.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
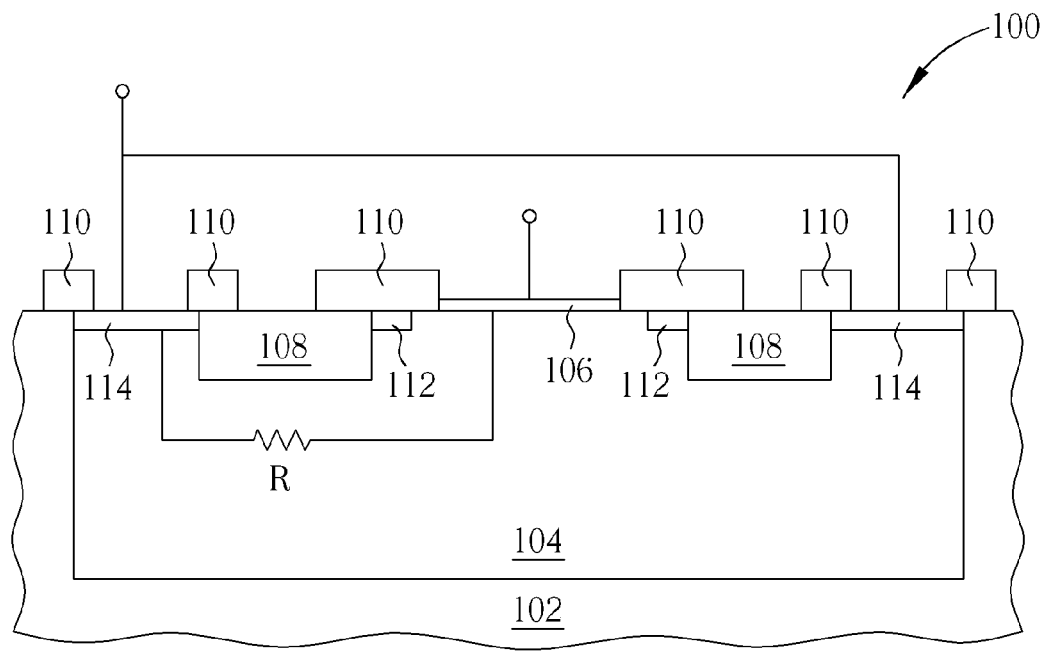
FIG. 1 is a schematic drawing of a cross-sectional view of a high voltage device having a Schottky diode provided by a first preferred embodiment of the present invention.

Please refer to FIG. 1, which is a schematic drawing of a cross-sectional view of a high voltage device having a Schottky diode provided by a first preferred embodiment of the present invention. As shown in FIG. 1, a high voltage device 100 includes a semiconductor substrate 102 is provided. The semiconductor substrate 102 is formed of semiconductor material having a first conductive type and the first conductive type preferably is a p-type, but not limited to this. The high voltage device 100 also includes a well region 104 having a second conductive type, that is an n-type in this preferred embodiment, formed in the semiconductor substrate 102. The well region 104 serves as a drift region that permits a more gradual voltage drop across the terminals and reduces the possibility of avalanche breakdown in this area of the high voltage device 100. Therefore the doping concentration of the well region 104 is adjustable according to the requirement to the high voltage device 100.

The high voltage device 100 includes a Schottky diode 106 formed on the semiconductor substrate 102 in the well region 104, a dielectric region such as a localized oxidation isolation (LOCOS) or preferably a shallow trench isolation (STI) 108 formed in the well region 104 of the semiconductor substrate 102, at least a salicide block (SAB) 110 positioned between the STI 108 and the Schottky diode 106, and at least a first heavily doped region 112 having the first conductive type, that is the p-type in this preferred embodiment, formed in well region 104 of the semiconductor substrate 100 under the SAB 110. It is noteworthy that the first heavily doped region 112 is non-contacting with the Schottky diode 106. The high voltage device 100 of the preferred embodiment is provided in a symmetrical configuration as shown in FIG. 1, even in a circular configuration with the Schottky diode 106 at the center and STI 108 encircling the Schottky diode 106, but not limited to this.

The high voltage device 100 of the preferred embodiment further includes a second heavily doped region 114 having the second conductive type, which is the n-type according to the preferred embodiment, in the well region 104 of the semiconductor substrate 102. The second heavily doped region 114 is formed adjacent to the STI 108, and particularly is formed on a side opposite to the Schottky diode 106.

In the preferred embodiment, the Schottky diode 106 includes titanium silicide, cobalt silicide, tantalum silicide and combinations thereof. The Schottky diode 106 is formed by performing a self-aligned silicidation (salicide) process. In the salicide process, the SAB 110 is formed on the semiconductor substrate 102 for preventing a portion of the silicon material from being reacted in the salicide process. Then a metal layer (not shown) is formed on the semiconductor substrate 102 and followed by performing an anneal treatment to react the metal with the underlying silicon. Additionally, another salicide layer (not shown) can be simultaneously formed on the second heavily doped region 114 for improving Ohmic contact. Since the salicide process is well-known to those skilled in the art, the details are omitted in the interest of brevity.

According to the first preferred embodiment, the Schottky diode 106 and the second heavily doped region 114 serve as the two terminals for applying voltages. As mentioned above, when a forward bias is applied, the signal input from the second heavily doped region 114 flows through the well region 104 under the STI 108 and reaches the Schottky diode 106 with the well region 104 serving as the drift region that permits voltage drops as mentioned above. In such a case, the well region 104 under STI 108 is regarded as a resistor R. When the high voltage signal passes through the resistor R, it is converted into an applicable low voltage signal. Consequently, the high voltage device 100 provided by the preferred embodiment has an operating voltage of about 20 Volt.

Furthermore, it is found a leakage current always occurs at the side wall of the STI 108, therefore the first heavily doped region 112 that is positioned adjacent to the STI 108 is further provided to prevent said leakage current.

Figure 2:
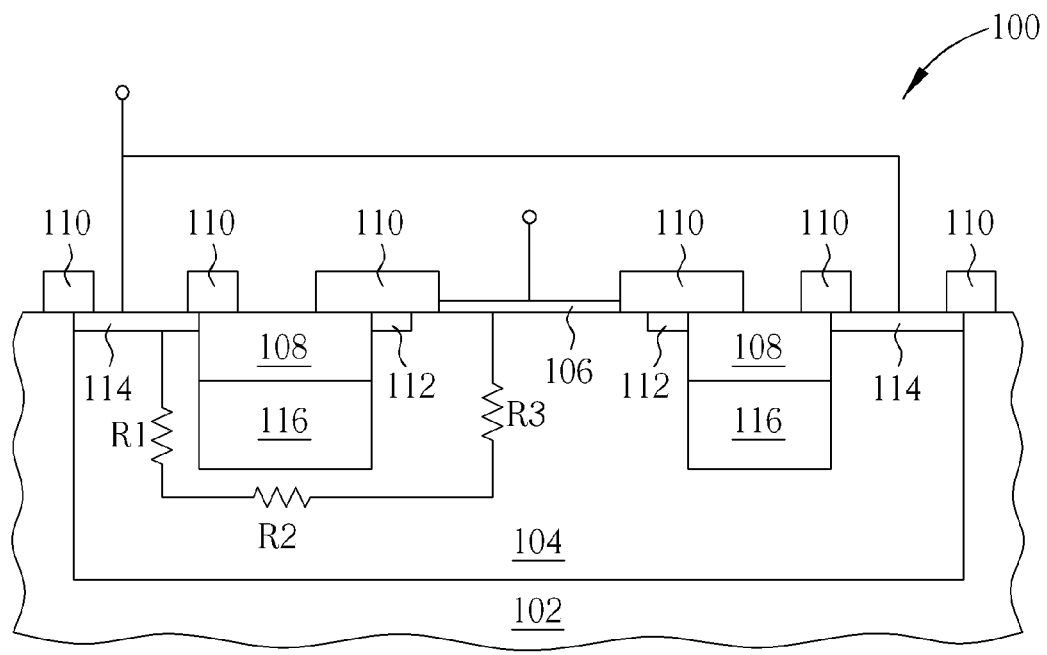
FIG. 2 is a modification to the high voltage device of the first preferred embodiment.

Please refer to FIG. 2, which is a modification to the high voltage device 100 of the first preferred embodiment. According to the modification, the high voltage device 100 further includes a doped region 116 having the first conductive type formed under the STI 108 in the well region 104 of the semiconductor substrate 102 for further improving the operating voltage of the high voltage device 100 of the preferred embodiment. Because of the doped region 116, the signals are enforced to across a prolonged pathway as shown in FIG. 2. In such a case, when the high voltage signal passes through the resistors $R_1$, $R_2$, $R_3$, which are regarded in series connection, the high voltage signal is converted into an even lower applicable voltage signal. It is noteworthy that the amount of the resistors merely are exemplarily disclosed, it is adjustable according to the doping depth or doping concentration of the doped region 116. Accordingly, the well region 104 provides more voltage drops and thus the high voltage device 100 has improved operating voltage.

Accordingly, the high voltage device 100 of the first preferred embodiment provides higher operating voltage and prevention of leakage current due to the first heavily doped region 112.

Figure 3:
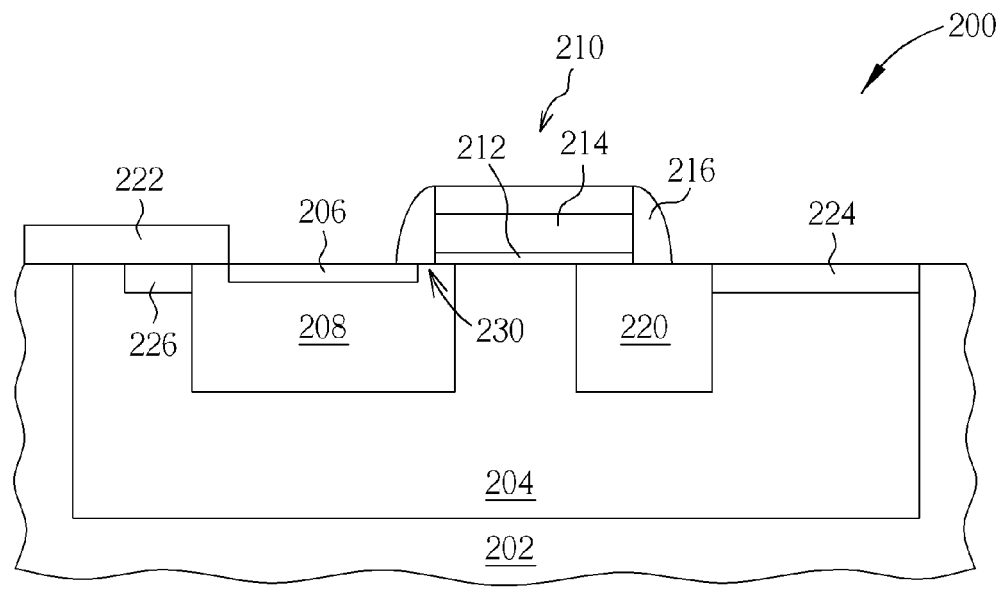
FIG. 3 is a schematic drawing of a cross-sectional view of a high voltage device having a Schottky diode integrated with a MOS transistor provided by a second preferred embodiment of the present invention.

Please refer to FIG. 3, which is a schematic drawing of a cross-sectional view of a high voltage device having a Schottky diode integrated with a MOS transistor provided by a second preferred embodiment of the present invention. As shown in FIG. 3, a high voltage device 200 including a semiconductor substrate 202 is provided. The semiconductor substrate 202 includes a first conductive type and the first conductive type preferably is a p-type, but not limited to this. The high voltage device 200 also includes a well region 204 having a second conductive type, that is an n-type in this preferred embodiment formed in the semiconductor substrate 202. The high voltage device 200 also includes a Schottky diode 206 formed on the semiconductor substrate 202 in the well region 204, at least a doped region 208 having a first conductive type formed in the well region 204 of the semiconductor substrate 202 and under the Schottky diode 206, a control gate 210 positioned on the semiconductor substrate 204, a dielectric region such as a LOCOS or preferably a STI 220 formed in the well region 204 of the semiconductor substrate 202, and a SAB 222 formed on the semiconductor substrate 202.

In the preferred embodiment, the Schottky diode 206 includes titanium silicide, cobalt silicide, tantalum silicide and combinations thereof. The Schottky diode 206 is also formed by performing a self-aligned silicidation (salicide) process. In the salicide process, the SAB 222 is formed on the semiconductor substrate 200 for preventing a portion of the silicon material from being reacted in the salicide process. Then a metal layer (not shown) is formed on the semiconductor substrate 200 and followed by performing an anneal treatment to react the metal with the underlying silicon. Since the salicide process is well-known to those skilled in the art, the details are omitted in the interest of brevity. As a result, the Schottky diode 206 is formed between the control gate 210 and the SAB 222.

As shown in FIG. 3, the doped region 208 is formed under the Schottky diode 206 and encompassing the entire bottom of the Schottky diode 206, the STI 220 is separated from the Schottky diode 206 and the doped region 208 by the well region 204 of the semiconductor substrate 202, and the control gate 210 is positioned between the Schottky diode 206 and the STI 220. Additionally, another doped region can be formed under the STI 220 in the well region 204. It is noteworthy that the control gate 210 covers a portion of the Schottky diode 206, a portion of the doped region 208 and a portion of the STI 220. Furthermore, the control gate 210 including at least a gate dielectric layer 212, a conductive layer 214 and a sidewall spacer 216 extending to cover a portion of the STI 220 as shown in FIG. 3.

Please still refer to FIG. 3. The high voltage device 200 of the preferred embodiment also includes a heavily doped region 224 having the second conductive type. The heavily doped region 224 is adjacent to the STI 220, and particularly, is formed at a side opposite to the control gate 210. That is, the heavily doped region 224 is separated from the control gate 210 by the STI 220. Additionally, another salicide layer (not shown) is simultaneously formed on the heavily doped region 224 for improving Ohmic contact.

According to the preferred embodiment, the Schottky diode 206 serves as an anode while the heavily doped region 224 serves as cathode. On the other hand, the Schottky diode 206, the control gate 210 and the heavily doped region 224 construct a n-type metal-oxide-semiconductor (NMOS) device with the Schottky diode 206 and the heavily doped region 224 respectively serve as the source and drain. It is noteworthy that a conventional silicon diode has a forward voltage drop of about 0.55-0.7 V and the Schottky diode has a forward voltage drop of about 0.2-0.3 V. In this preferred embodiment, a forward voltage is applied to the control gate 210 and thus a channel 230 is induced in the doped region 208 under the control gate 210 as shown in FIG. 3, therefore the forward voltage drop of the Schottky diode 206 is further lowered. Consequently, the turn-on speed of the Schottky diode 206 is extraordinarily accelerated. On the other hand, when a reverse voltage is applied to the control gate 210, the Schottky doped 206 is completely turned off. Briefly speaking, the control gate 210 is used to control the on/off state of the Schottky diode 206.

Furthermore, since the forward voltage of the Schottky diode 206 is lowered and the turn-on speed of the Schottky diode 206 is accelerated, when a feedback of high voltage is suddenly applied, the high voltage device 200 provided by the preferred embodiment is able to be turned on in time. Therefore the feedback is promptly bypassed through the high voltage device 200 without impacting other devices. Accordingly, the high voltage device 200 of the preferred embodiment serves as a protection device.

Please refer to FIG. 3 again. The high voltage device 200 of the preferred embodiment further includes another heavily doped region 226 having the second conductive type formed in the well region 204 under the SAB 222.

Accordingly, the high voltage device 200 of the second preferred embodiment has improved turn-on speed and thus the high voltage device 200 renders a protection function.

Figure 4:
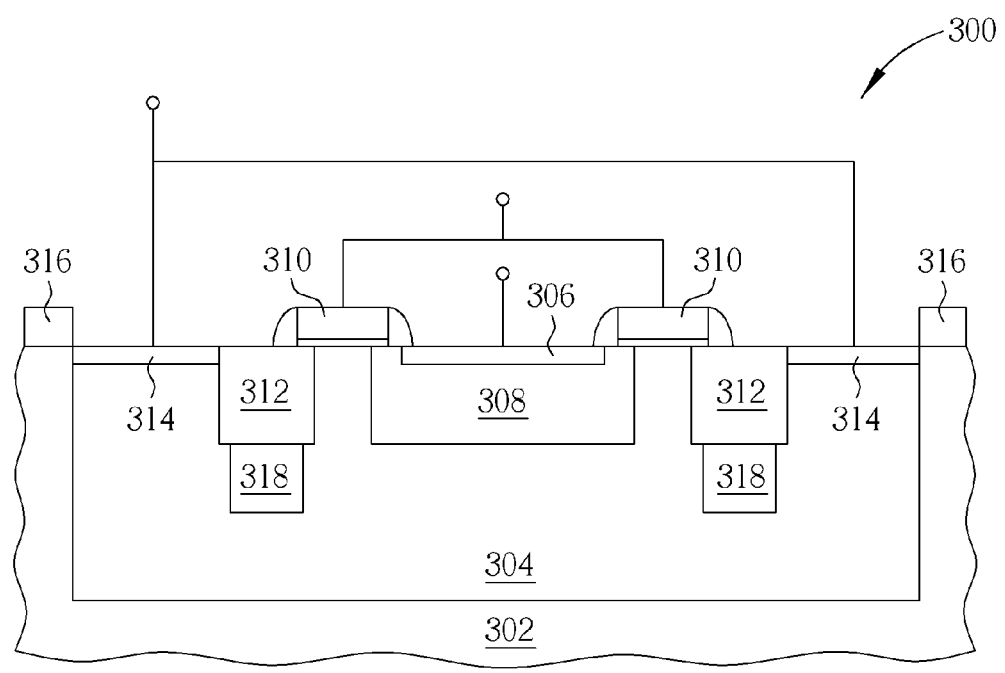
FIG. 4 is a schematic drawing of a cross-sectional view of a high voltage device having a Schottky diode provided by a third preferred embodiment of the present invention.

Please refer to FIG. 4, which is a schematic drawing of a cross-sectional view of a high voltage device having Schottky diode provided by a third preferred embodiment of the present invention. As shown in FIG. 4, the high voltage device 300 includes a semiconductor substrate 302 having a first conductive type. In the preferred embodiment, the first conductive type is preferably a p-type. The high voltage device 300 also includes a well region 304 having a second conductive type, that is an n-type, formed in the semiconductor substrate 302. The well region 304 serves as a drift region, therefore the doping concentration of the well region 304 is adjustable according to the requirement to the high voltage device 300.

The provided high voltage device 300 includes a Schottky diode 306 formed on the semiconductor substrate 302 in the well region 304 and a first doped region 308 formed under the Schottky diode 306 in the well region 304. The first doped region 308 under the Schottky diode 306 further encompasses the entire bottom of the Schottky diode 306. It is noteworthy that the high voltage device 300 of the preferred embodiment is provided in a symmetrical configuration with the Schottky diode 306 and the first doped region 308 at the center as shown in FIG. 4, it can be even in a circular configuration but not limited to this. The high voltage device 300 also includes a control gate 310 encircling the Schottky diode 306 and the first doped region 308 and a dielectric region such as a LOCOS or a preferably a STI 312 encircling the control gate 310 in the well region 304 of the semiconductor substrate 302. In other words, the control gate 310 is formed on the semiconductor substrate 302 and between the Schottky diode 306 and the STI 312. Furthermore, the control gate 310 covers a portion of the STI 312, a portion of the Schottky diode 306 and a portion of the first doped region 308 as shown in FIG. 4.

Please still refer to FIG. 4. The high voltage device 300 also includes a heavily doped region 314 encircling the STI 312 in the well region 304 of the semiconductor substrate 302 and at least a SAB 316 positioned on the semiconductor substrate 302. As shown in FIG. 4, the heavily doped region 314 is formed adjacent to the STI 312, and particularly is formed on a side opposite to the Schottky diode 306.

In the preferred embodiment, the Schottky diode 306 includes titanium silicide, cobalt silicide, tantalum silicide and combinations thereof. As mentioned above, the Schottky diode 306 is formed by performing a salicide process. And in the salicide process, the SAB 316 is formed on the semiconductor substrate 302 for preventing a portion of the silicon material from being reacted in the salicide process. Then a metal layer (not shown) is formed and followed by performing an anneal to react the metal with the underlying silicon. Additionally, another salicide layer (not shown) is simultaneously formed on the heavily doped region 314 for improving Ohmic contact.

As mentioned above, since the Schottky diode 306 provides forward voltage drop lower than conventional silicon diode, the Schottky diode 306 is integrated in the high voltage device 300 for lowering the forward voltage drop and improving the turn-on speed: The Schottky diode 306, the control gate 310 and the heavily doped region 314 construct an n-type HVMOS device with Schottky diode 306 and the heavily doped region 314 respectively serve as the drain/drain.

Please still refer to FIG. 4. The high voltage device 300 can further include a second doped region 318 formed under the STI 312. The second doped region 318 has the first conductive type, which is the p-type in the preferred embodiment. By forming the second doped region 318, the high voltage signal from the heavily doped region 314 is enforced to across a prolonged pathway, then reach the Schottky diode 306 and converted into a lower applicable voltage signal. It is noteworthy that the amount of the resistors (not shown) is adjustable according to the doping depth of the second doped region 318 as mentioned above. Accordingly, the well region 304 provides more voltage drops and thus the high voltage device 300 has improved operating voltage.

Accordingly, the present invention provides the high voltage device having the Schottky diode of the present invention, the advantage features of the present invention includes high operating voltage and prevention of leakage current due to the provided first heavily doped region. According to another high voltage device having the Schottky diode integrated with the MOS transistor, the advantage features of the present invention includes improved turn-on speed and thus such high voltage device renders a protection function.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage device having Schottky diode comprising:
    a semiconductor substrate;
    a Schottky diode formed on the semiconductor substrate;
    a first doped region having a first conductive type formed under the Schottky diode in the semiconductor substrate;
    a control gate covering a portion of the Schottky diode and the first doped region on the semiconductor substrate;
    a dielectric region formed in the semiconductor substrate, and the control gate covering a portion of the dielectric region;
    a salicide block (SAB) formed on the semiconductor substrate covering a portion of the first doped region, the Schottky diode is positioned between the control gate and the SAB; and
    a well region having a second conductive type formed in the semiconductor substrate and the dielectric region, the Schottky diode and the first doped region are formed in the well region and a portion of the well region is in between the first doped region and the dielectric region.

2. The high voltage device of claim 1, wherein the control gate is positioned between the dielectric region and the Schottky diode.

3. The high voltage device of claim 1, wherein the dielectric region is separated from the Schottky diode and the first doped region by the portion of the well region formed in the semiconductor substrate.

4. The high voltage device of claim 3, further comprising a first heavily doped region having the second conductive type adjacent to the dielectric region formed in the well region.

5. The high voltage device of claim 4, wherein the first heavily doped region is separated from the control gate by the dielectric region.

6. The high voltage of claim 1, further comprising a second heavily doped region having the second conductive type formed under the SAB in the semiconductor substrate.

* * * * *